(12) United States Patent
Jiang et al.

(10) Patent No.: US 9,605,344 B2
(45) Date of Patent: Mar. 28, 2017

(54) METHOD FOR ATOMIC LAYER DEPOSITION

(71) Applicant: STC.UNM, Albuquerque, NM (US)

(72) Inventors: Ying-Bing Jiang, Albuquerque, NM (US); Joseph L. Cecchi, Albuquerque, NM (US); Yaqin Fu, Albuquerque, NM (US); C. Jeffrey Brinker, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 14/917,566

(22) PCT Filed: Sep. 12, 2014

(86) PCT No.: PCT/US2014/055430
§ 371 (c)(1),
(2) Date: Mar. 8, 2016

(87) PCT Pub. No.: WO2015/038919
PCT Pub. Date: Mar. 19, 2015

(65) Prior Publication Data
US 2016/0222512 A1 Aug. 4, 2016

Related U.S. Application Data

(60) Provisional application No. 61/877,996, filed on Sep. 15, 2013.

(51) Int. Cl.
C23C 16/455 (2006.01)
C23C 16/46 (2006.01)

(52) U.S. Cl.
CPC .. *C23C 16/45525* (2013.01); *C23C 16/45534* (2013.01); *C23C 16/46* (2013.01)

(58) Field of Classification Search
None
See application file for complete search history.

(56) References Cited

U.S. PATENT DOCUMENTS

2004/0260059 A1 12/2004 Collins et al.
2007/0154946 A1 7/2007 Rajasekaran et al.
2008/0108149 A1 5/2008 Sundararajan et al.
(Continued)

OTHER PUBLICATIONS

Rempe SAND2012-9056J Oct. 2012 (abstract).*
(Continued)

*Primary Examiner* — Joseph Miller, Jr.
(74) *Attorney, Agent, or Firm* — MH2 Technology Law Group, LLP

(57) ABSTRACT

An atomic layer deposition method is disclosed for preparing polypeptides. The method comprises providing a solid-phase support comprising a reactive amine monolayer in an atomic layer deposition (ALD) chamber. The solid-phase support is contacted with a first protected amino acid substituted with a protecting group by atomic layer deposition, wherein the protecting group is bonded to a non-side chain amino group of the protected amino acid. A carboxylic acid group of the first protected amino acid is reacted with the reactive amine monolayer, thereby coupling the first protected amino acid to the solid-phase support to produce a coupled-product.

20 Claims, 4 Drawing Sheets

(56) References Cited

U.S. PATENT DOCUMENTS

2010/0204443 A1* 8/2010 Gazit ................. C23C 14/12
530/300

OTHER PUBLICATIONS

Fu JACS Oc 2014 p. 15821-824.*
International Search Report and Written Opinion of the International Searching Authority dated Feb. 25, 2015 from International Application No. PCT/US2014/055430, pp. 1-11.
Coffinier, Yannick et al. Peptide Immobilization on Amine-Terminated Boron-Doped Diamond Surfaces. Langmuir 2017, Mar. 2007, vol. 23, No. 8, pp. 4494-4497.
George, Steven M. et al. Surface Chemistry for Molecular Layer Deposition of Organic and Hybrid Organic-Inorganic Polymers. Accounts of Chemical Research, Feb. 27, 2009, vol. 42, No. 4, pp. 498-508.

* cited by examiner

FTIR for original BOC- Precursor

METHOD FOR ATOMIC LAYER DEPOSITION

FEDERALLY SPONSORED RESEARCH

This invention was made with government support under Contract No. FA 9550-10-1-0054 awarded by the AFOSR, contract No. DE-FG02-02-ER15368 awarded by DOE. The U.S. Government has certain rights in this invention.

RELATED APPLICATIONS

This invention is a 371 U.S. National Stage Application of International Patent Application No. PCT/US2014/055430 filed Sep. 12, 2014 which claims U.S. domestic priority under 35 U.S.C. 119 to provisional application No. 61/877, 996 filed Sep. 15, 2013, which is herein incorporated by reference in its entirety.

FIELD OF THE DISCLOSURE

The present disclosure is directed to a method of depositing polypeptides by atomic layer deposition.

BACKGROUND

Atomic Layer Deposition (ALD) is a burgeoning technology that has enabled the precision 'one-atomic-layer by one-atomic-layer' fabrication of thin films and free-standing materials. To date, a wide range of materials have been prepared by ALD including oxides, nitrides, sulfides and pure noble metals. In addition to inorganic materials, ALD of organic, polymeric materials has been reported recently.

In previous work, co-inventors of the present disclosure described ALD of hybrid organic-inorganic polysilsesquioxane thin films, and their conversion to high flux, high selectivity microporous membranes by subsequent removal of bridging organic groups from the organosilicate framework. Jiang, Y. B. et al., J. AM. CHEM. SOC. 2007, 129, 15446-15447. Overall there is a continuing need to extend ALD to new materials classes and structures with precisely designed, optimized properties.

The fabrication of biologically-inspired or biomimetic materials has gained increasing attention for applications in areas such as medicine, environmental monitoring and remediation, energy conversion, and bioengineering. Various polypeptides, which are polymers composed of amino acid subunits, have been synthesized by conventional liquid-phase or solid-phase processes, such as are disclosed by Han, S. Y. et al., Tetrahedron 2004, 60, 2447-2467; and Venkatesan, N. et al., Chem. Rev. 2006, 106, 3712-3761. However, these processes are time and labor-intensive and are not suitable for depositing thin films.

Demonstrating the feasibility of using a novel ALD process to precisely construct biomimetic materials would be a step forward in the art.

SUMMARY

An embodiment of the present disclosure is directed to an atomic layer deposition method for preparing polypeptides. The method comprises providing a solid-phase support comprising a reactive amine monolayer in an atomic layer deposition (ALD) chamber. The solid-phase support is contacted with a first protected amino acid substituted with a protecting group by atomic layer deposition, wherein the protecting group is bonded to a non-side chain amino group of the protected amino acid. A carboxylic acid group of the first protected amino acid is reacted with the reactive amine monolayer, thereby coupling the first protected amino acid to the solid-phase support to produce a coupled-product.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrates embodiments of the present teachings and together with the description, serve to explain the principles of the present teachings.

Figure 1:
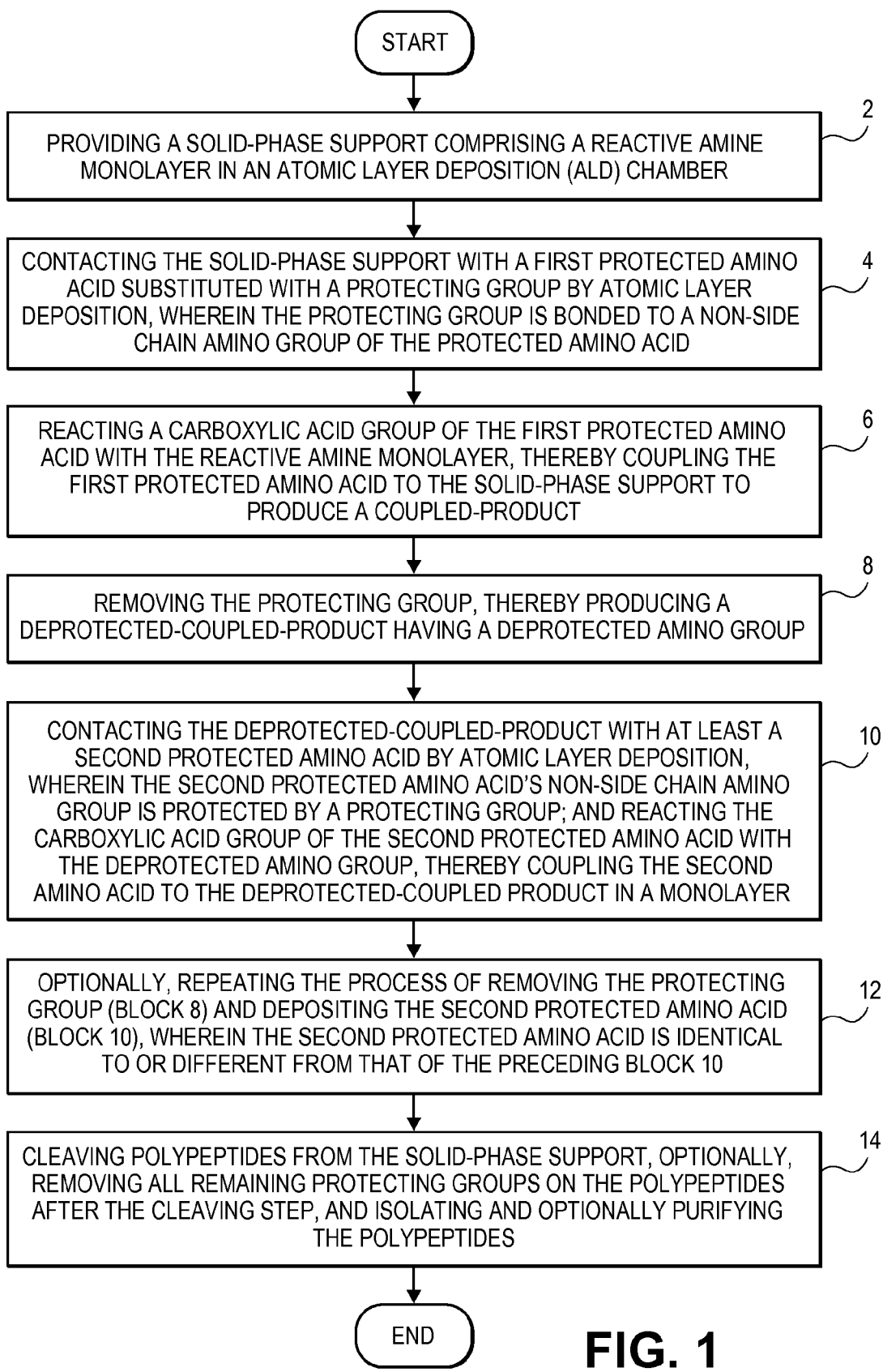
FIG. 1 is a flowchart of an atomic layer deposition method for preparing polypeptides, according to an embodiment of the present disclosure.

It should be noted that some details of the figure have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. In the drawings, like reference numerals have been used throughout to designate identical elements. In the following description, reference is made to the accompanying drawing that forms a part thereof, and in which is shown by way of illustration a specific exemplary embodiment in which the present teachings may be practiced. The following description is, therefore, merely exemplary.

Solid Phase Support

An embodiment of the present disclosure is directed to an atomic layer deposition method for preparing polypeptides. Referring to block 2 of FIG. 1, which illustrates an example flow of the method, the method comprises providing a solid-phase support in an atomic layer deposition (ALD) chamber. In an embodiment, the solid-phase support comprises a reactive amine monolayer positioned on a substrate.

Examples of a suitable substrate include a silica film or a plurality of silica nanoparticles or porous or non-porous inorganic materials, such as porous or non-porous oxides, nitrides, carbides, or polymeric materials, or metallic nanoparticles, or quantum dots. In an embodiment, the solid-phase support comprises a mesoporous silica film with the reactive amine monolayer positioned thereon.

The reactive amine monolayer can be formed by any suitable method. Methods for forming amine monolayers are well known in the art.

Deposition of First Amino Acid

Referring to blocks 4 and 6 of FIG. 1, the solid-phase support comprising the reactive amine monolayer is contacted with a first protected amino acid by atomic layer deposition. The protected amino acid comprises a non-side chain amino group protected by a protecting group and a carboxylic acid group. During deposition, the carboxylic acid group of the first amino acid is reacted with the reactive amine monolayer, thereby coupling the first amino acid to the solid-phase support to produce a coupled-product comprising a monolayer of the first amino acid.

Selecting an appropriate amino acid with a protecting group for the process can aid in resolving some challenging issues that are presented when depositing a polypeptide by ALD. These issues include that the vapor pressure of most amino acids is extremely low due to the inherent hydrogen bonding interactions between amine groups and carboxyl groups in their molecular structure. Therefore the amino acid precursor may be heated to achieve a sufficient vapor pressure for ALD. However, because each amino acid molecule contains both an amine group and a carboxyl group, spontaneous self-polymerization can occur when amino acids are heated in the precursor bottle or in the ALD chamber before reaching the sample surface. Self-polymerization can potentially preclude both the attainment of a sufficient vapor pressure and/or the ability to achieve precise layer-by-layer deposition.

One example of an amino acid that can aid in resolving the low vapor pressure and self-polymerization issues is N-(tert-Butoxycarbonyl)-L-alanine (also referred to herein as Boc-L-alanine). In Boc-L-alanine, the amine groups are "protected" by Boc groups that prevent or significantly reduce the reaction of the amine groups with carboxyl groups and thereby can avoid the problem of "self-polymerization". Moreover, compared to other common protecting groups, such as Carbobenzyloxy (Cbz), Benzoyl (Bz) and Fluorenylmethyloxycarbonyl (FMoc), the Boc group comprises three methyl ligands, which is advantageous in improving the molecular vapor pressure due to the weak bonding between methyl groups and other molecules. The vapor pressure of L-alanine amino acid is about $1.1 \times 10^{-7}$ Torr at 25° C., while the vapor pressure of Boc-L-alanine increases by 500 times to $6.3 \times 10^{-5}$ Torr at 25° C. The melting point also drops from 314° C. for L-alanine to 84° C. for Boc-protected L-alanine, suggesting that higher vapor pressure of Boc-protected L-alanine can be more easily achieved upon further heating.

That said, other protecting groups besides the example Boc groups can be employed, as long as sufficient vapor pressure and reduced self-polymerization can be achieved. Examples of potentially suitable protecting groups include tert-butoxycarbonyl (Boc) groups, carbobenzyloxy (Cbz) groups, benzoyl groups (Bz), fluorenylmethyloxycarbonyl (FMoc) groups, p-Methoxybenzyl carbonyl (Moz or MeOZ) groups, Benzyl (Bn) groups, Carbamate groups, p-Methoxybenzyl (PMB), 3,4-Dimethoxybenzyl (DMPM) , p-methoxyphenyl (PMP) groups and Tosyl (Ts) groups. In an embodiment, the protecting group is a tert-butoxycarbonyl (Boc) group.

In an embodiment, the amino acid can be at a temperature ranging from room temperature to about 250° C., such as about 100° C. to about 150° C. or 160° C., such as 110° C., upon introduction into the ALD chamber. In an embodiment, the contacting and reacting steps are carried out at a temperature that is sufficiently low so as not to cause decomposition of the first amino acid.

During deposition, the ALD chamber is maintained at any suitable deposition temperature, which may vary depending on the amino acid precursors employed, among other things. Example temperatures can range from room temperature (about 25° C.) to about 250° C., such as about 100° C. to about 200° C., such as about 120° C. to about 150° C. or about 160° C., such as about 130° C.

In an embodiment, the carboxylic acid group of the first amino acid is reacted with the reactive amine monolayer in the presence of a coupling agent in an atomic layer deposition (ALD) chamber. Any suitable coupling agent can be employed. Examples of suitable coupling agents include dicyclohexylcarbodiimide (DCC), 1-hydroxy-benzotriazole (HOBt), 1-hydroxy-7-aza-benzotriazole (HOAt) and diisopropyl-carbodiimide (DIC).

The coupling agent can be at a temperature ranging from about room temperature (about 25° C.) to about 250° C. upon introduction into the ALD chamber, such as about 100° C.

Removal of Protecting Group from First Amino Acid

Referring to block 8 of FIG. 1, after coupling the first amino acid to the solid-phase support to produce a coupled-product, the protecting group can be removed, thereby producing a deprotected-coupled-product having a deprotected amino group. In an embodiment, the protecting group is removed in the presence of a deprotecting agent.

The type of deprotecting agent that is used may depend on the temperatures employed in the ALD process, the particular amino acid and the type of protecting group on the amino acid. Examples of deprotecting agents include both weak and strong acids. Examples of weak acids include phosphoric acid, $CH_3COOH$ or $HCOOH$. Examples of strong acids include $HCl$ or $CF_3COOH$.

The deprotecting agent in vapor form is introduced into the ALD chamber at any suitable temperature that will remove the protecting group. In an example, the deprotecting agent can be at a temperature of about 70° C. upon introduction into the ALD chamber.

In an example, removing a protective Boc group after achieving a layer of chemisorbed Boc-L-alanine exposes activated amine groups for the subsequent deposition cycle. In conventional solution-phase polypeptide synthesis, strong acids such as Trifluoroacetate (TFA) and HCl are usually used to remove the Boc groups. However, ALD takes place within a vacuum chamber, as is well known in the art. In some cases, the strong acids may erode the ALD vacuum system and create hazardous by-products. In such cases, use of a weak acid, such as phosphoric acid ($H_3PO_4$), can be used to remove Boc groups for de-protection of amine groups while providing less damage to the ALD vacuum system and/or reducing hazardous by-products as compared to use of a strong acid. $H_3PO_4$ is a mild acid and considered safe at low concentration. In conventional liquid phase synthesis of polypeptides, $H_3PO_4$ is believed to be ineffective in removing Boc groups due to its weak acidity. But in ALD, where the reaction is usually carried out at elevated temperatures, such as 100-200° C. or higher, the weak acidity of phosphoric acid can be compensated for by the exponentially increased reaction rate at elevated temperatures. Thus, Boc removal by weak acids, such as $H_3PO_4$, can be an effective deprotection strategy in ALD reaction design.

Deposition of a Second Amino Acid

Referring to block 10 of FIG. 1, the deprotected-coupled-product can be contacted with at least a second amino acid by atomic layer deposition. The carboxylic acid group of the second amino acid is reacted with the deprotected amino group, thereby coupling the second amino acid to the deprotected-coupled product as a monolayer.

The second amino acid can be identical to or different from the first amino acid. As with the first amino acid, the second amino acid's non-side chain amino group is protected by a protecting group. In an embodiment, the first amino acid and/or the second amino acid do not have a side chain functionality requiring protection.

Referring to block 12 of FIG. 1, the processes of removing the protecting groups and depositing an amino acid, as discussed above with respect to blocks 8 and 10, can optionally be repeated any desired number of times. For example, the process can be repeated 0 to about 10,000 times, or about 1, 2 or 3 times to about 1000 times or about 5 or 10 times to about 100 or about 500 times.

Each time the processes of blocks 8 and 10 are repeated, the process for removing the protecting groups and/or depositing the amino acid can be the same or different than those described at blocks 8 and 10 of FIG. 1. For example, the amino acid can be identical to or different from those used in the deposition step of block 10. Thus, it is conceivable and feasible to prepare polypeptide depositions by ALD with hundreds or thousands of functional sections and controlled sequences, promising the ability to fabricate custom-designed bimimetic structures.

Optional Cleavage, Final Removal of Protecting Groups and/or Isolation of Polypeptide In an embodiment, the atomic layer deposition method further comprise one or more optional, additional steps, as shown at block 14 of FIG. 1. For example, the polypeptides can be cleaved from the solid-phase support. Any suitable techniques for cleaving the polypeptides from the support can be employed. One of ordinary skill in the art would readily be able to determine suitable cleaving techniques.

If desired, all remaining protecting groups on the polypeptides can be removed after the cleaving step. The protecting groups can be removed by any suitable method, including those methods discussed herein. In an embodiment, the polypeptides can be isolated and/or purified. Determining suitable techniques for isolating and/or purifying the polypeptides of the present disclosure is well within the skill of the ordinary artisan.

EXAMPLES

Materials used for the examples below included N-(tert-Butoxycarbonyl)-L-alanine(Boc-L-alanine), 3-aminopropyltrimethoxysilane (APMS), tetraethyl orthosilicate, 98% (TEOS) and Brij 56 surfactant, all of which were purchased from Sigma Aldrich. All chemicals were used as-received without further purification.

Example 1

Figure 2:
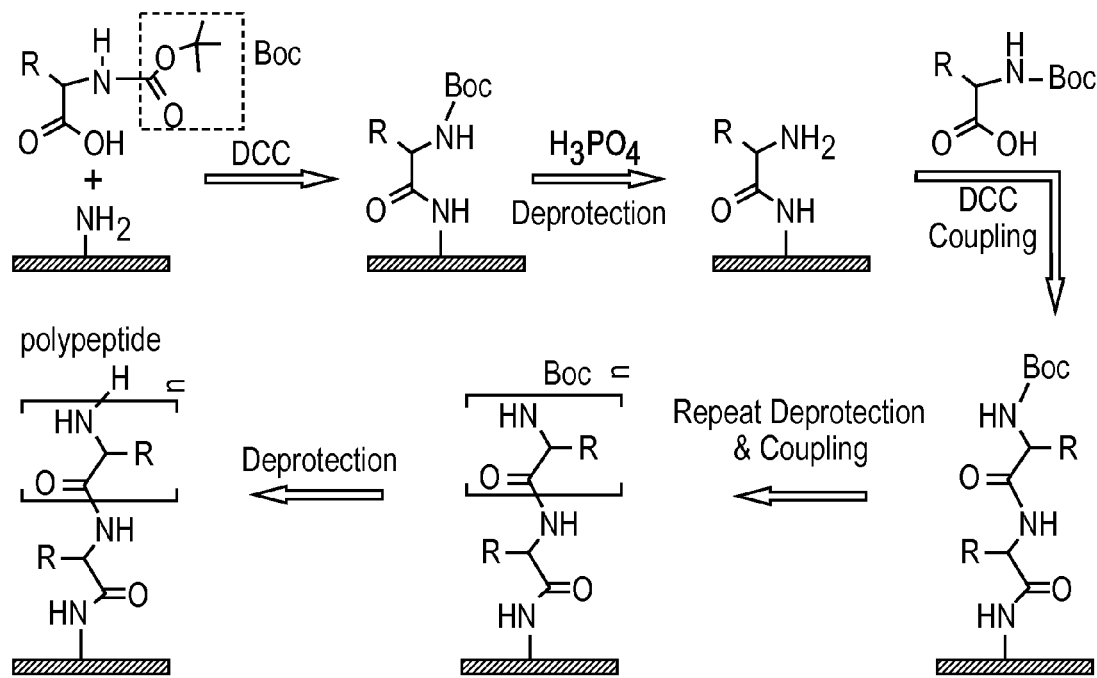
FIG. 2 shows a schematic diagram of an ALD process, according to an example of the present disclosure.

FIG. 2 shows an example ALD process. ALD for this example was carried out in an Angstrom-dep dual-chamber ALD system with an agitated powder ALD chamber. The deposition chamber was a 250 ml Pyrex container. The base vacuum was ~10 mTorr. Ar was used as the carrier gas as well as the purging gas. Both self-assembled mesoporous silica films and silica nanoparticles prepared by aerosol pyrolysis, as described by X. M. Jiang et al., *Chem. Commun.* 2012, 48, 1293-1295, the disclosure of which is hereby incorporated by reference in its entirety, were used as the substrates for ALD. Silica nanoparticles were used because it is easy to observe the thickness of the ALD coating on these nanoparticles by transmission electron microscopy (TEM). Mesoporous silica prepared by evaporation induced self-assembly was used because its high surface area makes it easy to check the deposition on the pore surface by FTIR.

The mesoporous silica film used as a support on which to perform ALD was prepared via silica/surfactant evaporation induced self-assembly as previously described by our laboratory in Brinker et al, *Adv. Mater* 1999, 11, 579-585, which is incorporated herein by reference in its entirety. To prepare the precursor solution, 3.1 ml TEOS and 0.56 g Brij 56 were dissolved in 15.5 ml ethanol ultrasonically. After that, 1.25 ml 0.07N HCl was added to the solution while stirring. The solution thus prepared was aged for 1 hr at room temperature. Then, the solution was spin-coated at 1000 rpm and 20% RH on a 20-nm anodisc™ anodized porous alumina substrate purchased from Whatman. After further drying at room temperature for 12 hours, the sample was calcined in an oven at 450° C. for 2 hr with 1° C./min ramp to the calcination temperature.

Before ALD, the silica particle or thin film sample surfaces were pre-treated with 3-aminopropyltrimethoxysilane (APMS) to form a reactive amine monolayer on sample surface so as to facilitate subsequent peptide polymerization. The thin film or particle samples were placed into the same ALD chamber. APMS precursor was heated at 50° C. and $H_2O$ was kept at room temperature. The samples were exposed alternatively to water vapor and APMS vapor for 5 cycles at 120° C. The dose time for APMS and $H_2O$ are all 3 s. The duration of the APMS and $H_2O$ exposures were both 15 seconds. The purge time for APMS and $H_2O$ were 20 s and 15 s, respectively.

As mentioned above, Boc-L-alanine was used as the ALD precursor and heated at 110° C. Phosphoric acid was used as deprotection agent and heated at 70° C. Besides these, N, N-Dicyclohexylcarbodiimide (DCC) was used as the coupling agent and heated at 100° C. The ALD temperature was maintained at 130° C.

ALD was performed according to the following steps: 1) introduce Boc-L-alanine vapor to the chamber, followed by injection of DCC vapor to trigger the coupling reaction between carboxyl groups in Boc-L-alanine and $-NH_2$ groups on sample surface, forming chemisorbed Boc-L-alanine on sample surface; 2) purge ALD chamber with Ar flow to remove residual Boc-L-alanine, DCC and the byproducts, leaving only a monolayer of chemisorbed Boc-L-alanine on the sample surface; 3) introduce phosphoric acid vapor to strip off Boc protective groups from the chemisorbed Boc-L-alanine, exposing $-NH_2$ groups; 4) purge the chamber with Ar to remove residual phosphoric acid and byproducts, generating a new $-NH_2$ terminated surface that is ready for another layer of chemisorption; 5) repeat the coupling and deprotection processes (steps 1-4) to obtain desired thickness. The dose time for Boc-L-alanine, DCC and $H_3PO_4$ were all 2 s. The duration time for Boc-L-alanine+DCC exposure was 30 seconds, and the duration time for $H_3PO_4$ exposure was also 30 s. To ensure complete removal of residual reactants and byproducts in each step, a long purge time was used, although shorter purge times are also feasible: the purge time after Boc-L-alanine+DCC exposure was 30 seconds, and the purge time after $H_3PO_4$ exposure was 30 s.

Example 2

Figure 3:
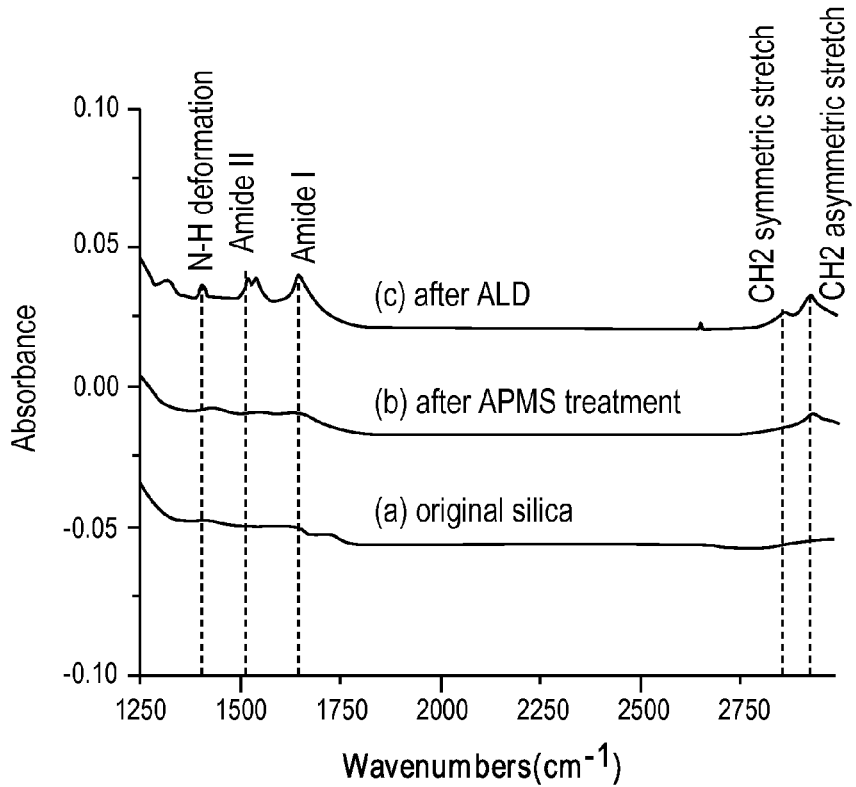
FIG. 3 shows ATR-FTIR spectra of: a) an original mesoporous silica sample; b) mesoporous silica after APMS treatment; and c) mesoporous silica after APMS treatment and 60 cycles of ALD, as discussed in the examples of the present disclosure.

The formation of a polypeptide on mesoporous silica as described in Example 1 was verified by ATR-FTIR. FIG. 3 shows the spectra of: a) the original mesoporous silica sample; b) mesoporous silica after APMS treatment; and c) mesoporous silica after APMS treatment and 60 cycles of ALD. In all spectra, backgrounds between 1800-2600 cm$^{-1}$ have been subtracted. For the sample after APMS treatment (spectrum b), there are two small absorptions at 2854 cm$^{-1}$ and 2925 cm$^{-1}$. Those can be attributed to symmetric and asymmetric C—H stretching vibrations in the —CH$_2$—CH$_2$—NH$_2$ ligand of APMS, suggesting that sample surface has been successfully modified with —NH$_2$ groups. Absorption by —NH$_2$ groups is not distinctive in this spectrum, which is normal as also observed by other researchers. See Ek, S., *J. Phys. Chem. B* 2004, 108 (28), 9650-9655, the disclosure of which is hereby incorporated by reference in its entirety. For the sample after polypeptide ALD (spectrum c), three more absorption peaks appear at 1400 cm$^{-1}$, 1647 cm$^{-1}$, and 1516 cm$^{-1}$. The absorption at 1400 cm$^{-1}$ can be assigned to the N—H deformation vibration. The absorptions at 1647 cm$^{-1}$ and 1516 cm$^{-1}$ are in agreement with amide I and amide II bonds, respectively, which are typical adsorptions from peptide bonds. The amide I absorption arises from the stretching vibrations of C=O bond in the amide structure, and the amide II absorption arises from the bending vibrations of the N—H bond in the amide structure. It is worthy to mention that original Boc-L-alanine precursor may exhibit similar Amide I and Amide II adsorptions in IR, but the position of Amide I is at 1716 cm$^{-2}$ instead of 1647 cm$^{-1}$. This data, combined with the mass spectrum data, discussed below, where long-chained molecules have been detected in the ALD samples, confirms the successful formation of a polypeptide by our ALD process. The absorptions related to C—H stretching at 2854 cm$^{-1}$ and 2925 cm$^{-1}$ became stronger in spectrum c because there are many —CH groups in this polypeptide structure.

Example 3—TEM Characterization

The ALD of a polypeptide film as described in Example 1 was further confirmed by TEM analysis, using the samples prepared on silica nanoparticles in the same ALD batches as for films. TEM analysis was carried out in a JEOL 2010F high resolution TEM/STEM microscope, using 200 kV accelerating voltage and spot size #2 illumination.

Figure 4A:
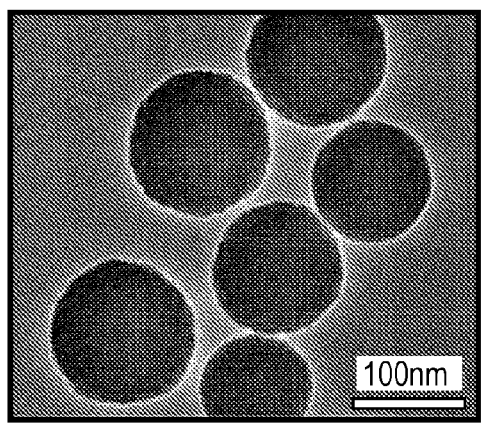
FIGS. 4A, 4B, 4C and 4D show TEM images of silica particles with and without ALD layers deposited thereon, as discussed in the examples of the present disclosure.
Figure 4B:
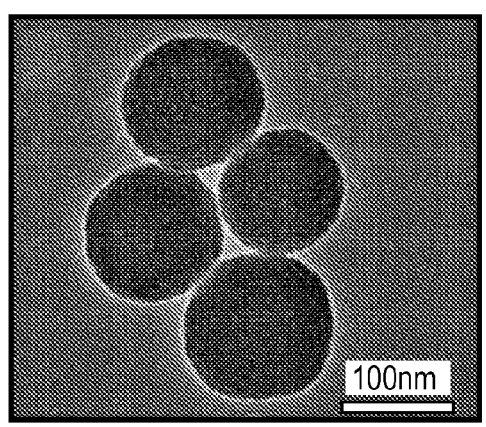
Figure 4C:
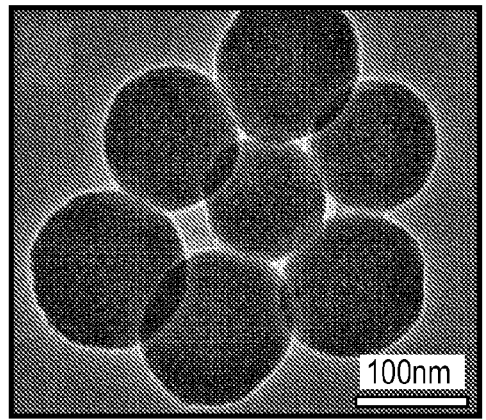
Figure 4D:
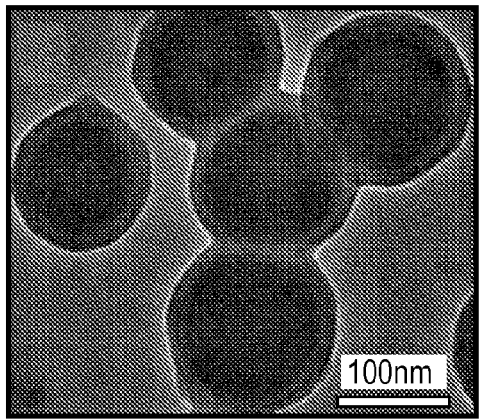

FIG. 4A is the TEM image of the original silica nanoparticle, where the particle surface is free of any coating except for some features related to surface roughness. FIG. 4B is the TEM image of the silica nanoparticles after APMS treatment. Here no substantial changes can be observed for the nanoparticles, suggesting that the APMS treatment only results in an extremely thin layer of modification for which the thickness is not detectable by TEM. This is in agreement with our expectation that the APMS modification thickness should be in the range of sub-monolayer to several monolayers. FIG. 4D is the TEM image of silica particles after subsequent ALD, where H$_3$PO$_4$ was used as the deprotectant to remove the Boc groups. In this image, an 18 nm thick coating can be observed on the surface of silica nanoparticles. The coating is conformal to the silica surface, which is consistent with the typical morphology of ALD-prepared coatings.

Example 4

After confirming the formation of polypeptide, it was confirmed that the deposition of polypeptide was achieved in a layer-by-layer manner as proposed in FIG. 1, where the deposition of each new layer relies on the removal of Boc protecting group by H$_3$PO$_4$. It has been reported that the Boc group attached to some amino acids may not be thermally stable, and that deprotection may take place at elevated temperatures. Rawal, V. H., *J. Org. Chem.* 1987, 52, 19-28.

If this occurs to the Boc-L-alanine precursor in the process of Example 1, the deposition of a coating would occur even in the absence of the deprotecting agent, H$_3$PO$_4$, via uncontrolled spontaneous self-polymerization as opposed to controlled layer-by-layer atomic layer deposition.

To help confirm our proposed synthetic scheme, as shown in FIG. 2, we conducted an additional ALD experiment where we performed the exact same sequence of exposure and purge cycles but with the deprotectant H$_3$PO$_4$ valve closed. FIG. 4C is the TEM image of the silica nanoparticle after being treated with APMS and subsequent ALD without H$_3$PO$_4$. In this image, the silica nanoparticles appear identical to those in FIG. 4B, suggesting that, although the Boc-L-alanine and DCC reactants were introduced into the deposition chamber at the same temperature, ALD was completely suppressed. This observation establishes that the Boc groups are thermally stable in the Boc-L-alanine precursor and that deprotection is necessary when activation of amine groups after each ALD cycle is desired to enable controlled layer-by-layer ALD. Consistently, mass spectrum data, as discussed below, also show that the majority chain length of those polypeptides is linearly dependent on the ALD cycles, which further suggested that the deposition took place in the typical layer-by-layer ALD fashion.

Example 5—FTIR Characterization and FTIR Data

ATR-FTIR was carried out using an NI Colet 6700 FT-IR by Thermo Electron Corporation, using DTGS KBr detector, resolution of "4.0" and number of scans of 200.

Figure 5:
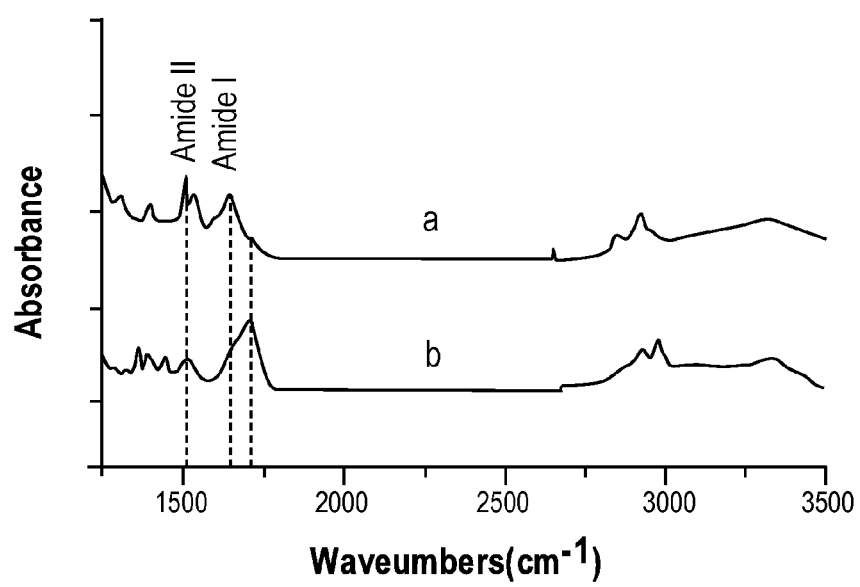
FIG. 5 shows additional FTIR data for: a) polypeptide made by ALD on mesoporous silica surface; and b) original Boc-L-Alanine precursor dissolved in acetone then dispersed on the mesoporous silica substrate, as discussed in the examples of the present disclosure.

FIG. 5 shows additional FTIR data for: a) polypeptide made by ALD on a mesoporous silica surface; b) original Boc-L-Alanine precursor dissolved in acetone then dispersed on the mesoporous silica substrate. This data shows that the Amide adsorptions for the two samples are slightly different.

Example 6—Mass Spectrum Measurements

MS spectrum analysis was carried out in a LCT Premier TOF Mass Spectrometer made by Waters Corporation. To prepare the sample for Mass Spectrum, the following procedure was followed:
  a. ALD of Polypeptides were made on silicon wafer coated with a thin layer (about 200 nm thick) of mesoporous silica, using the same conditions as the conditions that were used for silica nanoparticles of Example 1.
  b. After ALD, the silicon wafers with polypeptide were immersed in a 0.5% HF solution and sonicated. This step was done in a clean plastic bottle. After this step, mesoporous silica was dissolved, and the polypeptide grown on mesoporous silica was rinsed off from the Si wafer and thereby dispersed in the HF solution.
  c. The solvent (water) and the volatile solutes (HF, dissolved silica product SiF4) in the solution were then extracted under vacuum using a dry pump station, leaving polypeptide only in the bottle.
  d. The polypeptide left in the bottle was dissolved with DI water and sonicated, and the samples thus made were sent for MS analysis.

Figure 6:
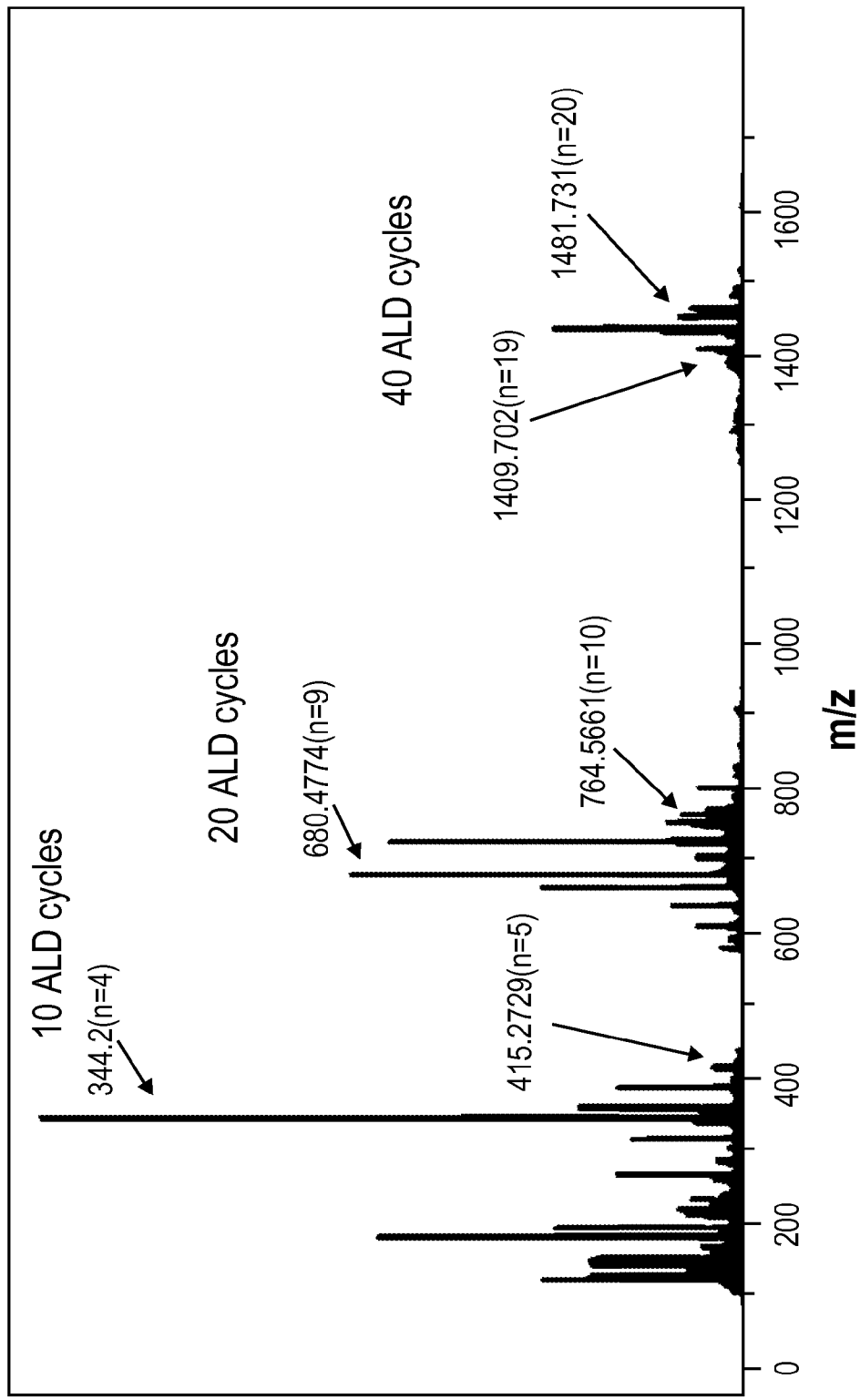
FIG. 6 shows mass spectra for polypeptide ALD samples, as discussed in the examples of the present disclosure.

FIG. 6 shows the mass spectra for the polypeptide ALD samples after 10, 20, and 40 cycles, respectively. Molecule weight (MW) corresponding to a polypeptide with 4-5 amino acid sections was observed for the 10-ALD-cycle sample; MW corresponding to a polypeptide with 9-10 amino acid sections can be observed for the 20-ALD-cycle sample; And MW corresponding to a polypeptide with 19-20 amino acid sections can be observed for the 40-ALD-cycle sample.

Some signals at 100-200 mass unit was probably due to contaminants, or some polypeptide fragments resulted from discontinued ALD processes. For example, the microporosity in mesoporous silica does not have enough room for the growth of longer-chained polypeptide. Therefore the growth of some polypeptides within those microporosities have to be discontinued. The average growth rate of the polypeptide seems to be very constant: about 0.5 chain per cycle. It is less than one full atomic (molecule) layer per cycle. The exact reason is not clear at this moment, but this "less than one layer/cycle growth rate" is actually very typical for almost any ALD process. Although the growth rate was not perfectly one layer per cycle, and some discontinuation of ALD took place, just like other ALD processes, this doesn't exclude its applications in precisely fabricating biomimetic nanostructures. In addition, by further optimizing the ALD conditions, we expect that better ALD results can be achieved.

Overall, this MS data demonstrated that polypeptides have for been formed in the ALD processes of the present disclosure, and the majority chain length or molecular weight of the polypeptide thus-deposited is linearly dependent on the ALD cycles.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. An atomic layer deposition method for preparing polypeptides, the method comprising:
   providing a solid-phase support comprising a reactive amine monolayer in an atomic layer deposition (ALD) chamber;
   contacting the solid-phase support with a first protected amino acid substituted with a protecting group by atomic layer deposition, wherein the protecting group is bonded to a non-side chain amino group of the protected amino acid; and
   reacting a carboxylic acid group of the first protected amino acid with the reactive amine monolayer, thereby coupling the first protected amino acid to the solid-phase support to produce a coupled-product.

2. The method of claim 1, wherein the ALD chamber is maintained at a temperature of about 100° C. to about 200° C.

3. The method of claim 2, wherein the ALD chamber is maintained at a temperature ranging from room temperature to 250° C.

4. The method of claim 2, wherein the first amino acid is at a temperature ranging from room temperature to 250° C. upon introduction into the ALD chamber.

5. The method of claim 2, wherein the contacting and reacting steps are carried out at a temperature that is not sufficient to cause decomposition of the first amino acid.

6. The method of claim 1, wherein the protecting group is a tert-butoxycarbonyl (Boc) group, a carbobenzyloxy (Cbz) group, a benzoyl group (Bz), a fluorenylmethyloxycarbonyl (FMoc) group, a p-Methoxybenzyl carbonyl (Moz or MeOZ) group, a Benzyl (Bn) group, a Carbamate group, a p-Methoxybenzyl (PMB) group, a 3,4-Dimethoxybenzyl (DMPM) group, a p-methoxyphenyl (PMP) group and a Tosyl (Ts) group.

7. The method of claim 1, wherein the protecting group is a tert-butoxycarbonyl (Boc) group.

8. The method of claim 1, wherein the protecting group is removed in the presence of an acid.

9. The method of claim 8, wherein the protecting group is a tert-butoxycarbonyl (Boc) group.

10. The method of claim 1, wherein the carboxylic acid group of the first protected amino acid is reacted with the reactive amine monolayer in the presence of a coupling agent in an atomic layer deposition (ALD) chamber.

11. The method of claim 10, wherein the coupling agent comprises at least one compound selected from the group consisting of dicyclohexylcarbodiimide (DCC), 1-hydroxybenzotriazole (HOBt), 1-hydroxy-7-aza-benzotriazole (HOAt) and diisopropyl-carbodiimide (DIC).

12. The method of claim 10, wherein the coupling agent is at a temperature ranging from room temperature to about 250° C. upon introduction into the ALD chamber.

13. The method of claim 1, further comprising:
   (a) removing the protecting group, thereby producing a deprotected-coupled-product having a deprotected amino group,
   (b) contacting the deprotected-coupled-product with at least a second protected amino acid by atomic layer deposition, wherein the second protected amino acid's non-side chain amino group is protected by a protecting group; and reacting the carboxylic acid group of the second protected amino acid with the deprotected amino group, thereby coupling the second amino acid to the deprotected-coupled product in a monolayer, and
   (c) optionally, repeating steps (a) and (b), wherein the second protected amino acid is identical to or different from that of the preceding step (b).

14. The atomic layer deposition method of claim 13, wherein the protecting group is removed in the presence of a deprotecting agent.

15. The atomic layer deposition method of claim 14, wherein the deprotecting agent an acid.

16. The atomic layer deposition of claim 14, wherein the method is carried out in an atomic layer deposition (ALD)

chamber and the deprotecting agent is at a temperature of about 70° C. upon introduction into the ALD chamber.

17. The atomic layer deposition method of claim 13, further comprising:
   cleaving polypeptides from the solid-phase support,
   optionally, removing all remaining protecting groups on the polypeptides after the cleaving step, and
   isolating and optionally, purifying the polypeptides.

18. The atomic layer deposition method of claim 13, wherein one or more of the first amino acid and the second amino acid do not have a side chain functionality requiring protection.

19. The atomic layer deposition method of claim 1, wherein the solid-phase support comprises at least one material selected from the group consisting of a silica film, a plurality of silica nanoparticles, porous inorganic materials, porous polymeric materials, or non-porous inorganic materials, non-porous polymeric materials, metallic nanoparticles or quantum dots.

20. The atomic layer deposition method of claim 1, wherein the solid-phase support comprises a mesoporous silica film.

\* \* \* \* \*